(12) United States Patent
Noro

(10) Patent No.: US 6,980,058 B2
(45) Date of Patent: Dec. 27, 2005

(54) AMPLIFIER CIRCUITRY

(75) Inventor: Masao Noro, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 51 days.

(21) Appl. No.: 10/744,503

(22) Filed: Dec. 22, 2003

(65) Prior Publication Data

US 2004/0135635 A1    Jul. 15, 2004

(30) Foreign Application Priority Data

Dec. 27, 2002  (JP) .............................. 2002-379692

(51) Int. Cl.[7] .............................................. H03F 1/52
(52) U.S. Cl. .................................. 330/298; 330/207 P
(58) Field of Search ............................... 330/129, 140, 330/207 P, 284, 298

(56) References Cited

U.S. PATENT DOCUMENTS 4,370,622 A * 1/1983 Hornbeck et al. ....... 330/207 P

* cited by examiner

Primary Examiner—Steven J. Mottola
(74) Attorney, Agent, or Firm—Pillsbury Winthrop Shaw Pittman LLP

(57) ABSTRACT

Input signal amplified by an input amplifier is delivered via a voltage limiter circuit to a power amplifier, and a speaker is driven by the signal amplifier by the power amplifier. Voltage produced across a resistor, which is proportional to an output current flowing to the speaker is detected by a current detecting amplifier, and the amplitude of the signal to be inputted to the power amplifier is controlled in accordance with the current value detected by the current detecting amplifier. Thus, the maximum output power can be controlled irrespective of impedance of the speaker. By also controlling the voltage limiter circuit in accordance with an instantaneous value of the output current, the continuous maximum output value and instantaneous maximum output value can be controlled independently of each other.

7 Claims, 4 Drawing Sheets

AMPLIFIER CIRCUITRY

BACKGROUND OF THE INVENTION

The present invention relates generally to amplifier circuitry for driving speakers and other loads.

Basically, amplifier circuitry (power amplifiers) for driving speakers and other loads produce voltage outputs and supply voltage signals to each load, at which time an electric current value is determined by impedance of the load. In the case where the load is a speaker, the impedance depends not only on the model of the speaker but also on a frequency employed. Therefore, the power amplifier has to adjust to a considerably great range of load impedance.

The output power from the power amplifier equals a product between the output voltage and the output current. The maximum output voltage depends on a power-supply voltage; however, because the power supply circuit has a regulation characteristic, the power-supply voltage decreases as the load current (output current) increases. Therefore, as load resistance decreases, the load current increases, but the maximum output voltage decreases. Consequently, although the maximum output power does not completely relate inversely to the load resistance, it generally changes in an increasing direction, so that the amplifier would break down due to excess current or excess power (heat), unless some means for limiting the output signal is provided somewhere.

Thus, most power amplifiers are provided with some form of limiter circuit (protection circuit) for protective purposes. Among various known examples of the limiter circuit are (1) a voltage limiter for limiting the output voltage, (2) a current limiter for limiting the output current, a PC limiter for limiting the power consumed by the amplifier, etc.

(1) Voltage Limiter:

In the case of amplifiers, clipping can be effected with a power-supply voltage in the absence of a limiter circuit, and thus no significant inconvenience would be encountered even where no voltage limiter circuit is provided; as a matter of fact, many amplifiers are provided with no limiter circuit. In such cases, because a clipped voltage of an output depends on the power-supply voltage, the clipped voltage varies with variation in the power-supply voltage. Also, in general, the power-supply voltage decreases as a load current increases as note earlier, so that the clipped voltage decreases too. This may appear to be disadvantageous from the viewpoint of an "ideal amplifier", but, in reality, it is not so. Ordinary constant-voltage limiter tends to present a great difference in output between loads of 8. and 2. (it may approach a value of an ideal amplifier and ideal power supply only seemingly); therefore, the constant-voltage limiter achieves little practical advantageous result, except in cases where such an effect is pursued on purpose.

(2) Current Limiter:

The current limiter performs a function essential for protection of an output element at the time of a load short-circuit, and it is activated when an output current exceeding a limit value flows when a load is short-circuited or has very low impedance. However, the current limiter would present the inconveniences that current clipping results in distorted signal waveforms because the impedance of a speaker includes a reactance component and that the output is a limited current that may prevent proper damping of the speaker. These inconveniences would lead to generation of unusual sounds uncomfortable to the auditory sense, and thus it is not desirable to activate the current limiter frequently for power control purposes during music reproduction. Therefore, the current limiter is normally used for the purpose of protecting and preventing the amplifier from breaking down due to an unusual load condition.

(3) PC Limiter:

The PC limiter is arranged to impart a limited current value of a current limiter with output-voltage depending characteristics. The PC limiter is advantageous in that it can set a small current limiting value and thus reduce physical burdens on an output element at the time of a load short-circuit. The PC limiter is more effective than the current limiter in terms of protection of the output element; however, because of its current limiting function, unusual sounds would be easily noticeable if the PC limiter is activated during music reproduction, as in the case of the above-mentioned current limiter.

In Japanese Patent Application Laid-open Publication No. HEI-10-173446, there has been proposed a power amplifier of the type which, in order to prevent an excessive output, compares an output voltage of a power amplifier section to a predetermined reference voltage value so as to lower an input signal level when the output voltage has exceeded the reference voltage, and in which the predetermined reference voltage is set to any one of a plurality of voltage values in accordance with a current supplied to the power amplifier section depending on a load.

Where an ideal amplifier, supplied with a current from an ideal power supply (complete constant-voltage power supply), provides a maximum output of 100 W for an 8 . load, the ideal amplifier will provide a maximum output of 200 W for an 4 . load and maximum output of 400 W for an 2 . load. There exist amplifiers designed simply on the basis of the though that amplifiers having maximum output characteristics close to an ideal amplifier are good amplifiers; however, it is practically necessary for audio amplifiers to adjust to loads of up to about 2 ., in which case the amplifiers have to be designed to stand an output of 400 W and therefore tend to increase in size. Further, because such amplifiers can produce an output of only 100 W when driving an 8 . speaker that is most popular on the market, they can never be preferable amplifiers from the viewpoints of rationality and practicality.

Namely, it is desirable that the maximum output of amplifiers be prevented from varying greatly even when the load impedance varies greatly, for example, from 2 . to 8 .

SUMMARY OF THE INVENTION

In view of the foregoing, it is an object of the present invention to provide amplifier circuitry which can control its maximum output-power to be substantially constant even when load impedance varies.

In order to accomplish the above-mentioned object, the present invention provides improved amplifier circuitry, which comprises: a voltage limiter circuit that limits an amplitude of an input signal; an amplifier that amplifies a signal inputted thereto via the voltage limiter circuit; and a detection section that detects an output current to be supplied from the amplifier to a load and outputs a signal corresponding to the detected output current. In the present invention, the voltage limiter circuit limits the amplitude of the signal to be inputted to the amplifier in accordance with the output of the detection section.

In an embodiment of the present invention, the voltage limiter circuit limits the amplitude of the signal to be inputted to the amplifier in accordance with an average value or root-mean-square value of the output of the detection section, and/or a peak value of the output.

In one embodiment of the present invention, the amplifier is a digital amplifier.

According to another aspect of the present invention, there is provided improved amplifier circuitry, which comprises: a voltage limiter circuit that limits an amplitude of an input signal; an amplifier that amplifies a signal inputted thereto via the voltage limiter circuit; and a detection section that detects an output voltage of the amplifier. Here, the voltage limiter circuit limits an amplitude of the signal to be inputted to the amplifier in accordance with an average value or root-mean-square value and a peak value of the output voltage detected by the detection section.

According to still another aspect of the present invention, there is provided improved amplifier circuitry, which comprises: a voltage limiter circuit that limits an amplitude of an input signal; an amplifier that amplifies a signal inputted thereto via the voltage limiter circuit; a first detection section that detects an output current to be supplied from the amplifier to a load; a second detection section that detects an output voltage of the amplifier; and a calculation section that calculates an output power of the amplifier on the basis of the output current detected by the first detection section and the output voltage detected by the second detection section. Here, the voltage limiter circuit limits an amplitude of the signal to be inputted to the amplifier in accordance with the output power calculated by the calculation section.

The following will describe embodiments of the present invention, but it should be appreciated that the present invention is not limited to the described embodiments and various modifications of the invention are possible without departing from the basic principles of the invention. The scope of the present invention is therefore to be determined solely by the appended claims.

BRIEF DESCRIPTION OF THE DRAWINGS

For better understanding of the object and other features of the present invention, its preferred embodiments will be described hereinbelow in greater detail with reference to the accompanying drawings, in which.

DETAILED DESCRIPTION OF THE INVENTION

Figure 1:
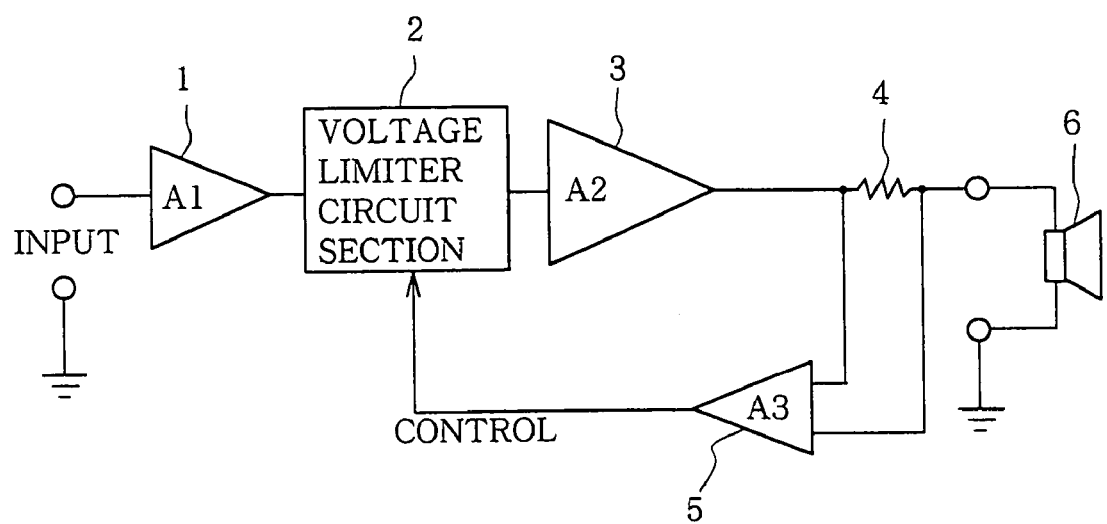
FIG. 1 is a block diagram showing a general setup of amplifier circuitry in accordance with a first embodiment of the present invention.

FIG. 1 is a block diagram showing a general setup of amplifier circuitry in accordance with a first embodiment of the present invention. The amplifier circuitry of FIG. 1 includes an input amplifier 1 for amplifying a voltage of an input signal, a voltage limiter circuit section 2 for limiting a voltage of an output signal from the input amplifier 1 in accordance with an output of a current detecting amplifier 5, and a power amplifier 3 for amplifying an output of the voltage limiter circuit section 2. The amplifier circuitry also includes a resistor 4 of a small resistance value inserted in series between an output terminal of the power amplifier 3 and a speaker (load) 6 for detecting an output current (load current) flowing to the speaker 6. The current detecting amplifier 5 is, for example, in the form of a differential amplifier that amplifies a voltage produced across the resistor 4. Note that the power amplifier 3 may be of either an analog amplifier or a digital amplifier.

The current detecting amplifier 5 has input/output voltage characteristics to output a voltage substantially proportional to a square root of an input voltage; the current detecting amplifier 5 is set to a relatively small gain. Further, the voltage limiter circuit section 2 is arranged to operate on the basis of an output obtained by averaging the output of the current detecting amplifier 5 by means of an integrating circuit etc.

The gain of the current detecting amplifier 5 and time constant of the above-mentioned integrating circuit etc. are set to provide moderate processing (processing with a small feedback amount) where the voltage limited by the voltage limiter circuit section 2 is lowered gradually as the output current is increased. If an extremely great feedback amount is set, steep processing is provided where the voltage limiter circuit section 2 drastically clips the voltage once the output current exceeds a predetermined reference value. Thus, in the amplifier circuitry of the present invention, the gain of the current detecting amplifier 5 is set to a relatively small value so as to provide a relatively small feedback amount. For example, when impedance of the speaker 6 is 2 . , the gain of the current detecting amplifier 5 and time constant of the above-mentioned integrating circuit etc. in the embodiment are set so that the voltage limiter circuit section 2 clips with a greater current than (current twice as great as) when the impedance of the speaker 6 is 8 .

Figure 2:
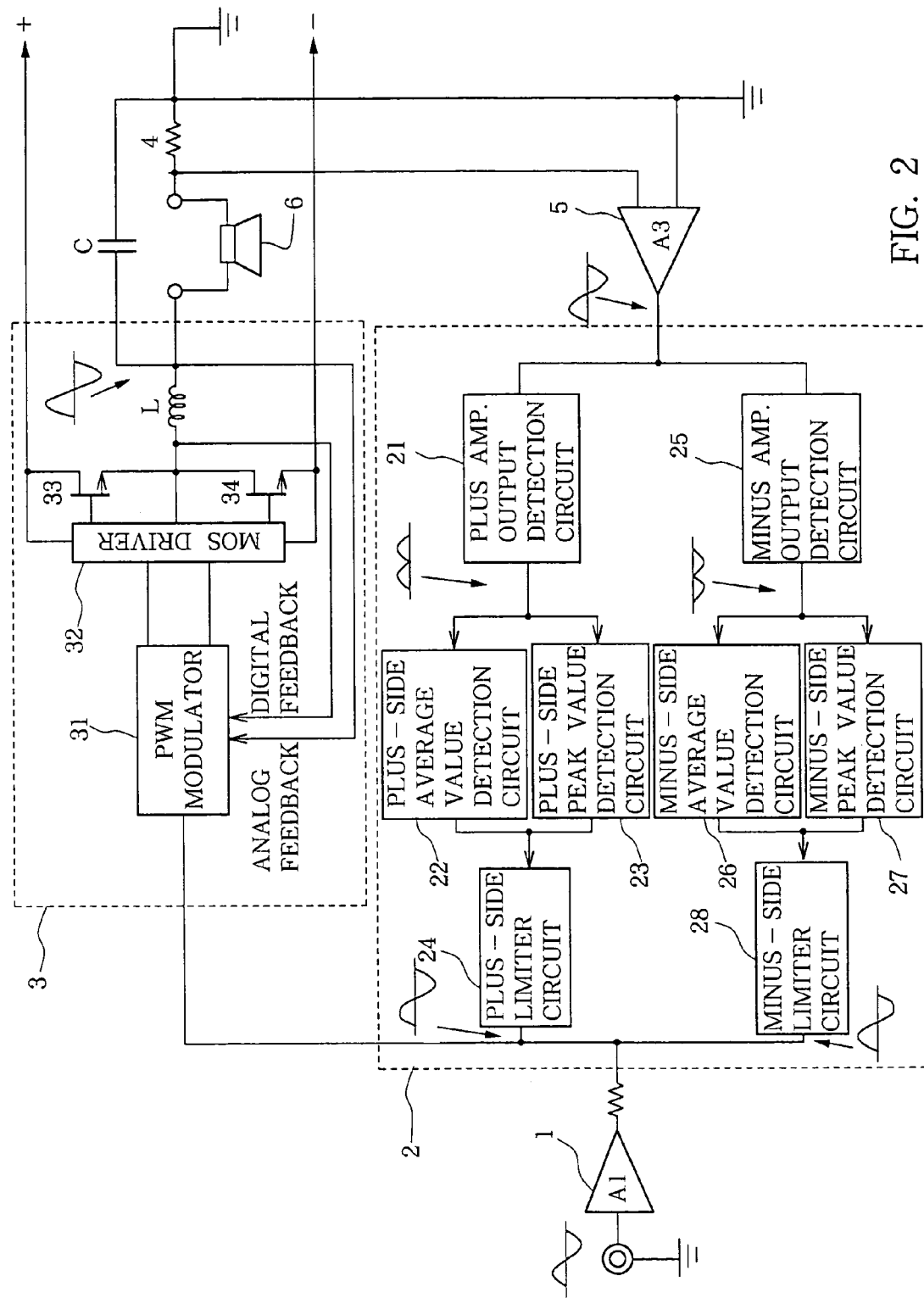
FIG. 2 is a block diagram showing a second embodiment of the amplifier circuitry of the present invention.

FIG. 2 is a block diagram showing a second embodiment of the amplifier circuitry of the present invention. In the second embodiment of FIG. 2, an input amplifier 1, voltage limiter circuit section 2, power amplifier 3, resistor 4, current detecting amplifier 5 and speaker 6 are similar in structure and function to those shown in the first embodiment of FIG. 1. Here, the power amplifier 3 is a digital power amplifier, which includes MOSFETs 33 and 34 that are switched on/off via a PWM (Pulse Width Modulation) modulator circuit 31 and driver circuits 32 and 33 and driven by positive and negative power supplies. To the PWM modulator circuit 31 are applied digital feedbacks from the outputs of the MOSFETs 33 and 34 and analog feedback from an output terminal coupled to the speaker 6, so as to provide high-quality outputs.

In the second embodiment, the voltage limiter circuit section 2 includes, at each of its plus and minus sides, an amplifier output detection circuit for detecting the output of the current detecting amplifier 5, a peak value detection circuit and average value detection circuit for detecting a peak value and average value of the output of the amplifier output detection circuit, and a limiter circuit for limiting an amplitude of the output voltage of the input amplifier 1 on the basis of the outputs of the peak value and average value detection circuits.

More specifically, at the plus side of the voltage limiter circuit section 2, there are provided a plus amplifier output detection circuit 21 for outputting a plus-side signal generated by full-wave rectifying the output of the current detecting amplifier 5, a plus-side average value detection circuit 22 for detecting an average value of the output of the plus amplifier output detection circuit 21, a plus-side peak value detection circuit 23 for detecting a peak value of the output of the plus amplifier output detection circuit 21, a plus-side limiter circuit 24 controlled by the outputs of the plus-side average value detection circuit 22, and a plus-side peak value detection circuit 23. Similarly, at the minus side of the voltage limiter circuit section 2, there are provided a minus amplifier output detection circuit 25, a minus-side average value detection circuit 26, a minus-side peak value detection circuit 27, and a minus-side limiter circuit 28.

The above-mentioned peak value detection circuits 23 and 27 each detect an instantaneous peak value of the output of the corresponding output detection circuit 21 or 25, and the average value detection circuits 22 and 26 each detect an average value or root-mean-square value of the output of the corresponding output detection circuit 21 or 25.

In the second embodiment of the amplifier circuitry thus arranged, an input signal is delivered to the PWM modulator circuit 31 after being voltage-amplified by the input amplifier 1, and it is converted into a pulse-width modulated signal by the modulator circuit 31. The driver circuit 31 is driven by the output of the PWM modulator circuit 31 to perform ON/OFF control of the output transistors 33 and 34, so that the speaker 6 is driven via a low-pass filter composed of an inductance L and capacitance C. Voltage corresponding to a load current flowing to the speaker 6 is produced across the resistor 4, and the thus-produced voltage is amplified by the current detecting amplifier 5 with a relatively small gain and then passed to the voltage limiter circuit section 2. The plus amplifier output detection circuit 21 of the limiter circuit section 2 outputs a plus-side signal produced by full-wave rectifying the output of the current detecting amplifier 5, and the plus-side peak value detection circuit 23 and plus-side average value detection circuit 22 respectively detect peak and average values of the plus-side output signal of the plus amplifier output detection circuit 21. When the peak and average values exceed respective predetermined reference values, the plus-side limiter circuit 24 is activated to limit the plus-side amplitude of the voltage output of the input amplifier 1. In a similar manner, the minus-side amplitude of the voltage output of the input amplifier 1 is limited via the minus amplifier output detection circuit 25, minus-side average value detection circuit 26, minus-side peak value detection circuit 27 and minus-side peak value detection circuit 28.

Namely, in the second embodiment of the amplifier circuitry, the amplitude of the input voltage to the voltage limiter circuit section 2 is limited not only when the plus- and minus-side average value detection circuits 22 and 26 are each detecting that the average value of the load current exceeds the predetermined reference value, but also when the plus- and minus-side peak value detection circuits 23 and 27 are each detecting that the instantaneous value of the load current exceeds the predetermined reference value. In this way, both the continuous maximum output and the dynamic power of the amplifier circuitry can be controlled independently.

Further, with the arrangement that the amplifier output detection circuits, average value detection circuits and peak value detection circuits, provided at both sides of the voltage limiter circuit section 2, control the plus-side limiter circuit and minus-side limiter circuit, respectively, the second embodiment can perform the voltage limiting process in a reliable manner.

Figure 3:
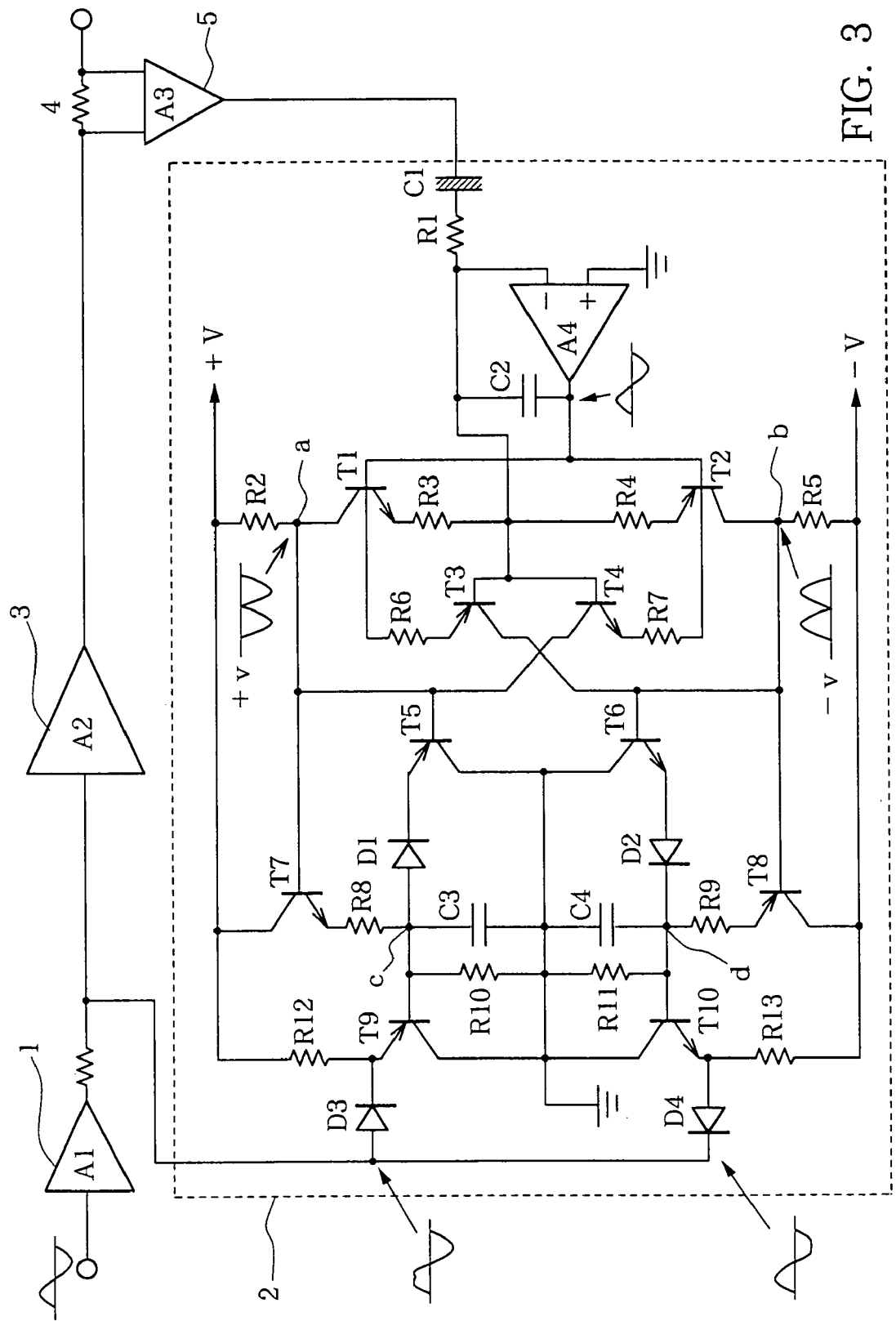
FIG. 3 is a diagram showing an example detailed structure of a voltage limiter circuit section employed in the second embodiment of FIG. 2.

FIG. 3 is a diagram showing an example detailed setup of the voltage limiter circuit section 2 employed in the embodiment of FIG. 2, where the input amplifier 1, power amplifier 3, resistor 4 and current detecting amplifier 5 are of the same construction and function as set forth above.

The voltage produced across the resistor 4 and proportional to the load current is amplified by the current detecting amplifier 5, and an A.C. component of the voltage amplified by the current detecting amplifier 5 is supplied to an inverting input terminal of an amplifier A4 via a series circuit of a capacitor C1 and resistor R1. Capacitor C2 is connected between an output terminal and the inverting input terminal of the amplifier A4. As noted earlier, the current detecting amplifier 5 is set to a relatively small gain.

Resistor R2, collector and emitter of an npn transistor T1, resistors R3 and R4, emitter and collector of a pnp transistor T2, and resistor R5 are connected in series between positive and negative power supplies +V and −V. Output of the amplifier A4 (i.e., one end of the capacitor C2) is coupled to the respective bases of the transistors T1 and T2, and the other end of the capacitor C2 is connected to a connection point between the resistors R3 and R4.

Further, the collector and emitter of an npn transistor T4 and resistor R7 are connected in series between a connection point ("a" point) of the resistor R2 and collector of the transistor T1 and the output terminal of the amplifier A4. In addition, the collector and emitter of a pnp transistor T3 and resistor R6 are connected in series between a connection point ("b" point) of the resistor R5 and collector of the transistor T2 and the output terminal of the amplifier A4. The respective bases of the transistors T3 and T4 are interconnected, and the other end of the capacitor C2 is connected to a connection point between the resistors R3 and R4.

The output of the amplifier A4 is subjected to full-wave rectification by a circuit structure constituted by the transistors T1–T4 and resistors R2–R7. Namely, when the output of the amplifier A4 is positive, the transistor T1 and transistor T3 are turned on or energized, while, when the output of the amplifier A4 is negative, the transistor T2 and transistor T4 are energized. Thus, at the "a" point, there is produced a voltage (plus-side detection output) as a result of subtraction, from the positive power-supply voltage, of the full-wave rectified output of the amplifier A4, and, at the "b" point, there is produced a voltage (minus-side detection output) as a result of addition, to the negative power supply voltage, of a voltage obtained from the full-wave rectified output of the amplifier A4.

The above-mentioned "a" point is also connected to the base of the pnp transistor T5 having its collector grounded and to the base of an npn transistor T7 having its collector connected to the positive power supply +V. Further, one end of a resistor R8 is connected to the emitter of the npn transistor T7, and the anode of a diode D1 having its cathode connected to the emitter of the pnp transistor T5 is connected to the other end of the resistor R8. Resistor R10 and capacitor C3 are connected in parallel between a connection point ("c" point) of the resistor R8 and anode of the diode D1 and the ground. The "c" point is also connected to the base of a pnp transistor T9 having its emitter connected via a resistor R12 to the positive power supply +V and its collector grounded. Further, the cathode of a diode D3 having its anode connected to the output of the input amplifier 1 is connected to the emitter of the pnp transistor T9.

The components set forth above constitute the plus-side average value detection circuit 22, plus-side peak value detection circuit 23 and plus-side limiter circuit 24 of the voltage limiter circuit section 2 shown in FIG. 2.

The above-mentioned "b" point is also connected to the base of an npn transistor T6 having its collector grounded and to the base of a pnp transistor T8 having its collector connected to the negative power supply −V. Further, one end of a resistor R9 is connected to the emitter of the npn transistor T8, and the other end of the resistor R9 is connected to the cathode of a diode D2 having its anode connected to the emitter of the npn transistor T6. Resistor R11 and capacitor C4 are connected in parallel between a connection point ("d" point) of the resistor R9 and cathode of the diode D2 and the ground. The "d" point is also connected to the base of an npn transistor T10 having its emitter connected via a resistor R13 to the negative power supply −V and its collector grounded. Further, the anode of a diode D4 having its cathode connected to the output of the input amplifier 1 is connected to the emitter of the npn transistor T10.

The components set forth above constitute the minus-side average value detection circuit 26, minus-side peak value detection circuit 27 and minus-side limiter circuit 28 of the voltage limiter circuit section 2 shown in FIG. 2.

In the second embodiment thus arranged, a voltage obtained by dividing the positive power-supply voltage +V via the resistors R8 and R10 is charged into the capacitor C3 while the transistor T7 is ON in response to the voltage at the "a" point. The voltage charged in the capacitor C3 is discharged through the resistor S10 while the transistor T7 is OFF. Thus, the voltage at the "c" point corresponds to an average value of the plus-side full-wave rectified voltage produced at the "a" point. Then, when a difference between the output voltage of the input amplifier 1 and the voltage at the "c" point is greater than about 1.2 V (i.e., sum between a forward voltage drop of the diode D3 and emitter-base voltage of the transistor T9), the diode D3 and transistor T9 are turned on, so that the output voltage of the input amplifier 1 is limited so as not to exceed a sum among the voltage at the "c" point, forward voltage drop of the diode D3 and emitter-base voltage of the transistor T9. In this manner, when the average value of the output current has exceeded a predetermined reference value determined by the resistors R8, R10 and capacitor C3, the instant embodiment can limit the plus-side amplitude of the input amplifier 1.

Once the voltage at the "a" point instantaneously drops greatly to go below a predetermined reference value, the transistor S5 is turned on, and the output voltage of the input amplifier 1 is limited so as not to exceed a sum among the forward voltage drop of the diode D3, emitter-base voltage of the transistor T9, forward voltage drop of the diode D1 and emitter-base voltage of the transistor T5. In this manner, the instant embodiment can limit the instantaneous maximum power (dynamic power) so as not to exceed a predetermined value. Note that the reference values may be modified in accordance with the number of the diode D1.

At the minus side too, a circuit structure constituted by the transistors T6, T8, T10, diodes D2, D4, resistors R9, R11, R13 and capacitor C4 operates in the above-described manner, so that the rated output (continuous maximum output) and instantaneous maximum power (dynamic power) can be controlled to not exceed respective preset values.

As previously set forth, the relatively small gain of the current detecting amplifier 5, and the time constant of the circuit composed of the resistors R8 and R10 and capacitor C3 or the circuit composed of the resistors R9 and R11 and capacitor C4 are set to provide a small feedback amount such that the limited voltage is gradually reduced as the output current increases.

In this manner, the rated output and dynamic power can be kept substantially constant irrespective of the load impedance, and can be set independently of each other.

Whereas the embodiment has been described above as controlling the rated output and dynamic power independently of each other by detecting the load current, the rated output and dynamic power may be controlled independently of each other by detecting the load voltage. Namely, in such a case, the output voltage of the power amplifier 3 is detected, and, when an average value of the detected output voltage has exceeded a predetermined reference value, the voltage limiter circuit section 2 is controlled so as to limit the amplitude of the input voltage to the power amplifier 3. Also, when it is detected that the peak power (instantaneous value) of the output voltage of the power amplifier 3 has exceeded a predetermined reference value, the voltage limiter circuit section 2 is controlled so as to limit the amplitude of the input voltage to the power amplifier 3.

In this way, the rated output and dynamic power can be controlled independently of each other.

Alternatively, both the load current and the output voltage may be detected so that the voltage limiter circuit section 2 can be controlled in accordance with the output power determined on the basis of the detected load current and output voltage.

Figure 4:
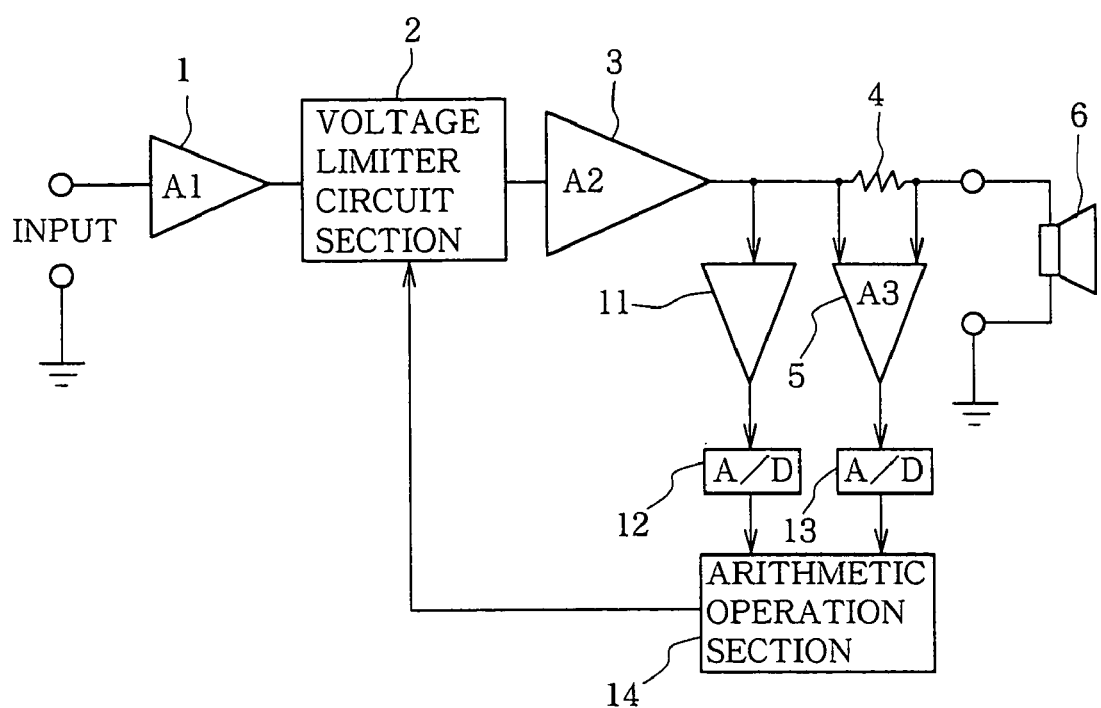
FIG. 4 is a block diagram showing a general setup of amplifier circuitry in accordance with still another embodiment of the present invention.

FIG. 4 is a block diagram showing a general setup of still another embodiment of the present invention where an output power is calculated and the voltage limiter circuit section 2 is controlled using the calculated output power. In the figure, the same elements as employed in FIG. 1 are represented by the same reference characters, and these elements will not be described to avoid unnecessary duplication.

In FIG. 4, a buffer amplifier 11 connected to the output terminal of the power amplifier 3 receives an output voltage of the power amplifier 3 and passes the received voltage to an A/D converter 12. Further, a voltage corresponding to an output current produced across the resistor 4 and output from the current detecting amplifier 5 is delivered to an A/D converter 13. Digital data corresponding to the output voltage of the power amplifier 3 output form the A/D converter 12 and digital data corresponding to the current output from the A/D converter 13 are supplied to an arithmetic operation section 14, for example, in the form of a microcomputer or the like, where the supplied digital data are multiplied to calculate an output power. The arithmetic operation section 14 further calculates an average value of the calculated output power and compares the calculated average value to a reference value. If the calculated average value is greater than the reference value, the arithmetic operation 14 outputs a control signal to the voltage limiter circuit section 2 so as to control the amplitude of the input signal to the power amplifier 3; for example, the arithmetic operation section 14 supplies the voltage limiter circuit section 2 with a signal to turn on the transistors T9 and T10 of FIG. 3. Also, when the instantaneous value of the calculated output voltage is greater than a predetermined reference value, the arithmetic operation section 14 outputs a similar control signal.

In this embodiment, the voltage limiter circuit section 2 can be controlled in accordance with the output power of the power amplifier 3, so that the rated power and dynamic power can be controlled with increased accuracy. Note that, in a case where a microcomputer is provided to control the amplifiers, such a microcomputer may be used also as the above-mentioned arithmetic operation section 14.

In summary, the amplifier circuitry of the present invention arranged in the above-described manner permits substantially the same maximum output voltage for each of loads of, for example, 2 . to 8 .. Thus, physical burdens on the amplifiers, such as those resulting in heat generation, can be reduced effectively. Conversely, if the same head generation amount is tolerated, the present invention can increase the maximum output power for the load impedance of 8.

Further, because the maximum output is limited using the voltage limiter circuit, the present invention can produce a clipped waveform similar to that produced by voltage clipping in an ordinary amplifier. The amplifier output in the present invention can keep constant voltage characteristics to present a fair undistorted clipped waveform even at the time of clipping, and thus, even when clipping is effected during music reproduction, the present invention can provide tone quality similar to that achieved by voltage clipping in an ordinary amplifier, preventing generation of unwanted unusual sound.

Further, because the continuous maximum output and dynamic power can be controlled independently of each other, the present invention permits settings suitable for an intended use of the amplifier.

What is claimed is:

1. Amplifier circuitry comprising:
   a voltage limiter circuit that limits an amplitude of an input signal;
   an amplifier that amplifies a signal inputted thereto via said voltage limiter circuit; and
   a detection section that detects an output current to be supplied from said amplifier to a load and provides an output a signal corresponding to the detected output current,
   wherein said voltage limiter circuit limits an amplitude of the signal to be inputted to said amplifier if the output signal of said detection section is greater than a predetermined reference value and does not limit the amplitude of the signal to be inputted to said amplifier if the output signal of said detection section is less than or equal to the predetermined reference value.

2. Amplifier circuitry as claimed in claim 1 wherein said voltage limiter circuit limits the amplitude of the signal to be inputted to said amplifier in accordance with an average value of the output or root-mean-square value of the output of said detection circuit only.

3. Amplifier circuitry as claimed in claim 1 wherein said voltage limiter circuit limits the amplitude to be inputted to said amplifier in accordance with a peak value of the output of said detection means only.

4. Amplifier circuitry as claimed in claim 1 wherein a plus-side voltage limiter circuit limits the amplitude to be inputted to said amplifier in accordance with a plus-side average detection circuit and a plus-side peak value detection circuit, and said minus-side voltage limiter circuit also limits the amplitude to be inputted to said amplifier in accordance with a minus-side average detection circuit and a minus-side peak value detection circuit.

5. Amplifier circuitry, comprising:
   a voltage limiter circuit that limits an amplitude of an input signal;
   an amplifier that amplifies a signal inputted thereto via said voltage limiter circuit; and
   a detection section that detects an output current to be supplied from said amplifier to a load and provides an output signal corresponding to the detected output current,
   wherein said voltage limiter circuit limits an amplitude of the signal to be inputted to said amplifier in accordance with the output signal of said detection section, and said amplifier is a digital amplifier.

6. Amplifier circuitry comprising:
   a voltage limited circuit that limits an amplitude of an input signal;
   an amplifier that amplifies a signal inputted thereto via said voltage limiter circuit; and
   a detection section that detects an output voltage of said amplifier,
   wherein said voltage limiter circuit limits an amplitude of the signal to be inputted to said amplifier in accordance with a peak value of the output voltage and an average value or root-mean-square value detected by said detection section if the output of said detection section exceeds a predetermined reference value and does not limit the amplitude of the signal if the output of said detection section is lower or equal to the predetermined reference value.

7. Amplifier circuitry comprising:
   a voltage limiter circuit that limits an amplitude of an input signal;
   an amplifier that amplifies a signal inputted thereto via said voltage limiter circuit;
   a first detection section that detects an output current to be supplied from said amplifier to a load;
   a second detection section that detects an output voltage of said amplifier;
   a first analog-to-digital converter to receive the detected output current of the first detection section and to generate first digital data representative of the detected output current;
   a second analog-to-digital converter to receive the detected output voltage of the second detection section and to generate second digital data representative of the detected output voltage; and
   a calculation section that calculates an output power of said amplifier on the basis of the first digital data and the second digital data,
   wherein said voltage limiter circuit limits an amplitude of the signal to be inputted to said amplifier in accordance with the output power calculated by said calculation section.

* * * * *